United States Patent
Lee et al.

(10) Patent No.: US 9,855,703 B2
(45) Date of Patent: Jan. 2, 2018

(54) METHOD OF FORMING ALIGNED PATTERN IN PATTERN FORMATION REGION BY USING IMPRINT PROCESS

(71) Applicant: Samsung Electronics Co., Ltd., Suwon-si, Gyeonggi-do (KR)

(72) Inventors: Sunghoon Lee, Seoul (KR); Dongouk Kim, Pyeongtaek-si (KR); Joonyong Park, Suwon-si (KR); Jihyun Bae, Seoul (KR); Bongsu Shin, Seoul (KR); Jaeseung Chung, Suwon-si (KR); Sukgyu Hahm, Gyeongju-si (KR); Jong G. Ok, Seoul (KR); Ilsun Yoon, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 397 days.

(21) Appl. No.: 14/724,898

(22) Filed: May 29, 2015

(65) Prior Publication Data

US 2016/0023399 A1    Jan. 28, 2016

(30) Foreign Application Priority Data

Jul. 25, 2014  (KR) .......................... 10-2014-0095014

(51) Int. Cl.
| | |
|---|---|
| *B29C 59/16* | (2006.01) |
| *B29C 67/00* | (2017.01) |
| *G03F 7/00* | (2006.01) |
| *B29C 45/00* | (2006.01) |

(52) U.S. Cl.
CPC ............ *B29C 59/16* (2013.01); *B29C 59/165* (2013.01); *B29C 67/00* (2013.01); *G03F 7/0002* (2013.01); *B29C 2045/0075* (2013.01)

(58) Field of Classification Search
CPC .................. B29C 59/16; B29C 59/165; B29C 2045/0075; B29C 67/00; G03F 7/0002
USPC .......................... 264/447, 494, 496, 319, 349
See application file for complete search history.

(56) References Cited

U.S. PATENT DOCUMENTS

| | | | |
|---|---|---|---|
| 6,943,117 B2 | 9/2005 | Jeong et al. | |
| 8,262,961 B2 | 9/2012 | Dipietro et al. | |
| 8,318,066 B2 | 11/2012 | Sreenivasan et al. | |
| 2009/0256287 A1* | 10/2009 | Fu ......................... | B82Y 10/00 264/447 |
| 2010/0112220 A1 | 5/2010 | Hodge et al. | |
| 2011/0163345 A1 | 7/2011 | Fukunaga | |
| 2015/0079793 A1* | 3/2015 | Hattori .................. | C08F 299/02 438/703 |

FOREIGN PATENT DOCUMENTS

| | | |
|---|---|---|
| JP | 2004-207488 A | 7/2004 |
| KR | 1020070105040 A | 10/2007 |

* cited by examiner

*Primary Examiner* — William Phillip Fletcher, III
(74) *Attorney, Agent, or Firm* — Cantor Colburn LLP

(57) ABSTRACT

A method of forming a pattern by using an imprint process includes: forming an adhesion promoting layer only in a pattern formation region on a substrate; coating a resin to cover the substrate and the adhesion promoting layer; transferring a pattern of a stamp mold to the resin covering the substrate and the adhesion promoting layer, by pressing the stamp mold onto the resin; irradiating ultraviolet light onto the resin covering the substrate and the adhesion promoting layer, to cure the resin and form a pattern of the cured resin to correspond to the pattern of the stamp mold, on the substrate; and detaching the stamp mold from the substrate, to leave a portion of the cured resin pattern only on the adhesion promoting layer on the substrate and to remove a remaining portion of the cured resin pattern from the substrate.

12 Claims, 4 Drawing Sheets

METHOD OF FORMING ALIGNED PATTERN IN PATTERN FORMATION REGION BY USING IMPRINT PROCESS

CROSS REFERENCE TO RELATED APPLICATIONS

This application claims priority to Korean Patent Application No. 10-2014-0095014, filed on Jul. 25, 2014, and all the benefits accruing therefrom under 35 U.S.C. §119, the disclosure of which is incorporated herein in its entirety by reference.

BACKGROUND

1. Field

Provided are methods related to forming an aligned pattern in a pattern formation region, by using an imprint process.

2. Description of the Related Art

Nano imprint lithography is a nano/micro patterning technology that may replace photolithography and electron beam lithography. In a nano imprint process, when a resin curable by light of a specific wavelength is coated on a substrate and then is pressed by using a mold having an opposite shape to a pattern to be formed, a fluidic resin fills an empty space of the mold due to a capillary phenomenon. The resin is cured by light irradiation and then the mold is removed to form a pattern on the substrate.

In general, in a device fabricating process, a pattern formed by a nano imprint process may be used as a sacrificial layer in a subsequent process. For example, the pattern may be an etching mask.

SUMMARY

In order to use a pattern formed by a nano imprint process in an actual device during a fabricating process thereof, the pattern is formed only in a specific region of a substrate to allow a subsequent process during the device fabrication process to be performed. However, in an actual nano imprint process, since a portion of the pattern is formed outside the specific region of the substrate due to misalignment during mold contact, or since a burr is formed due to a relatively thick accumulation of a resin that leaks from a mold during pressing, performing a subsequent process within the device fabrication process is difficult.

Therefore, in order to perform a subsequent process within the device fabrication process smoothly and accurately, a nano imprint process whereby a uniform pattern may be formed in a specific region of a substrate is desired.

Provided are methods of forming an aligned pattern only in a specific region of a substrate without the occurrence of a burr, in a nano imprint process.

Additional features will be set forth in part in the description which follows and, in part, will be apparent from the description, or may be learned by practice thereof.

Provided is a method of forming an aligned pattern by using an imprint process, the method including: forming an adhesion promoting layer only in a pattern formation region on a first substrate; coating a resin on the first substrate to cover the adhesion promoting layer; transferring a first pattern of a stamp mold to the resin coated on the first substrate and covering the adhesion promoting layer, by pressing the stamp mold onto the resin coated on the first substrate and covering the adhesion promoting layer; irradiating ultraviolet light onto the resin coated on the first substrate and covering the adhesion promoting layer, to cure the resin and form a second pattern of the cured resin to correspond to the first pattern of the stamp mold, on the first substrate; and detaching the stamp mold from the first substrate, to leave a portion of the cured resin second pattern only on the adhesion promoting layer on the first substrate and to remove a remaining portion of the cured resin second pattern from the first substrate.

The forming the adhesion promoting layer may include: forming a mask on the first substrate to expose the pattern formation region; forming an adhesion promoting material layer on the mask to cover the mask and to cover the pattern formation region; and removing the mask from the first substrate to remove a portion of the adhesion promoting material layer formed in a region outside the pattern formation region.

The adhesion promoting material layer may include an ultraviolet-curable material.

The adhesion promoting material layer may include a solution including a silane coupling agent.

The adhesion promoting material layer may be formed in a dry state to have a thickness of about 10 nanometers (nm) or less.

The adhesion promoting layer may be formed by spin coating or vapor deposition.

The forming the mask may include attaching a mask material layer onto the first substrate by an electrostatic force or a reversible bonding.

The mask material layer may include a polymer film or a release film.

The forming the adhesion promoting layer may include: forming a mask on the first substrate to expose a surface of the substrate in the pattern formation region; and performing an oxygen plasma treatment or an ultraviolet ozone treatment on a surface of the first substrate exposed in the pattern formation region.

The curing of the resin may include chemically bonding the adhesion promoting layer and the resin to each other.

The method may further include: forming an adhesive layer on a second substrate separate from the first substrate; pressing the stamp mold including the remaining portion of the cured resin second pattern thereon, onto the second substrate including the adhesive layer thereon, such that the remaining portion of the cured resin second pattern on the stamp mold contacts the adhesive layer on the second substrate; and detaching the stamp mold from the second substrate to leave the remaining portion of the cured resin second pattern in contact with the adhesive layer on the second substrate and to remove the remaining portion of the cured resin second pattern from the stamp mold.

The adhesive layer may include a double-sided tape.

BRIEF DESCRIPTION OF THE DRAWINGS

These and/or other embodiments will become apparent and more readily appreciated from the following description of the embodiments, taken in conjunction with the accompanying drawings in which.

DETAILED DESCRIPTION

Figure 1A:
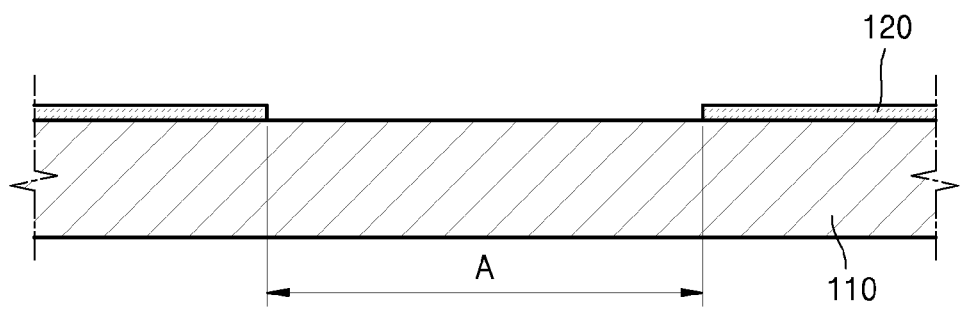
FIGS. 1A to 1F are cross-sectional views schematically illustrating a method of forming an aligned pattern in a pattern formation region by using an imprint process according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain the invention.

Hereinafter, embodiments will be described in detail with reference to the accompanying drawings. In the drawings, the thicknesses of layers and regions are exaggerated for clarity. The embodiments described below are merely exemplary, and various modifications may be made therein.

It will be understood that when a layer is referred to as being "on" another layer or substrate, it may be directly on the other layer or substrate, or one or more intervening layers may also be present. Throughout the specification, like reference numerals are used to denote like elements and redundant descriptions thereof will be omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIGS. 1A to 1F are cross-sectional views schematically illustrating a method of forming an aligned pattern in a pattern formation region by using an imprint process according to an embodiment.

Referring to FIG. 1A, a first substrate 110 is prepared. The first substrate 110 may include glass or silicon. However, the invention is not limited thereto. In an embodiment, for example, the first substrate 110 may also include plastic or the like.

A mask 120 is formed on the first substrate 110, in a region other than a pattern formation region A. That is, the mask 120 is formed to expose (e.g., not overlap) the pattern formation region A. The mask 120 may include a material that may be relatively easily attached to the first substrate 110 by an electrostatic force with respect to a material of the first substrate 110. In an embodiment, for example, the mask 120 may include a plastic film such as a polyethylene terephthalate ("PET") film. When the mask 120 includes the plastic film, the mask 120 may be relatively easily detached from the first substrate 110 in a subsequent process within the method of forming an aligned pattern.

The mask 120 may include a material that is reversibly bonded to the first substrate 110. In an embodiment, for example, the mask 120 may include a release film. Polycarbonate ("PC"), polyethylene naphthalate ("PEN"), or the like may be used as the release film.

Also, the mask 120 may include a tape that may be attached to the first substrate 110.

Figure 1B:
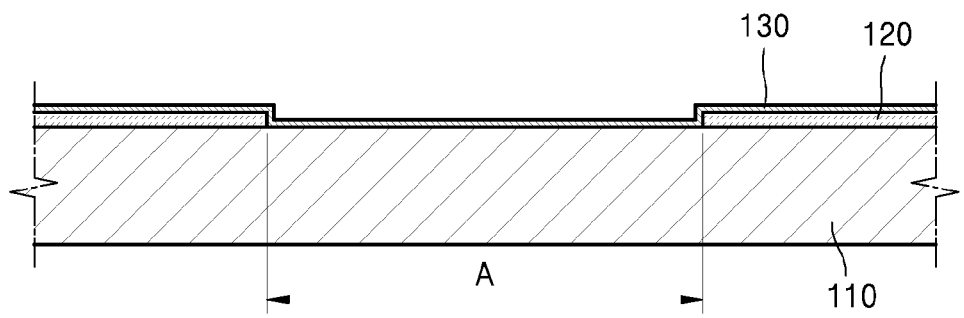

Referring to FIG. 1B, to increase an adhesive force within the pattern formation region A, an adhesion promoting layer 130 is formed on the first substrate 110 to cover the first substrate 110 and to cover the mask 120. The material for forming the adhesion promoting layer 130 may include an ultraviolet ("UV")-curable material. In an embodiment, for example, the material for forming the adhesion promoting layer 130 may include a solution including a silane-based coupling agent. Ethanol or the like may be used as a solvent.

The silane-based coupling agent may include τ-glycidoxy propyl trimethoxysilane, mercapto propyl trimethoxysilane, methyl trimethoxysilane, or trialkoxysilane.

The material for forming the adhesion promoting layer 130 may be formed on the first substrate 110 by spin coating, drop dispensing or deposition.

The material for forming the adhesion promoting layer 130, coated on the first substrate 110, may be formed to cover not only the pattern formation region A exposed by the mask 120 but also a periphery of the pattern formation region A and/or a top surface of the first substrate 110.

The material for forming the adhesion promoting layer 130 may be formed in a dry state to have a monolayer thickness. In an embodiment, for example, the material for forming the adhesion promoting layer 130 may be formed to a thickness of about 2 nanometers (nm) depending on a material thereof. Also, the material for forming the adhesion promoting layer 130 may be formed to a thickness of about 10 nm or less. When the material for forming the adhesion promoting layer 130 is formed to a thickness of more than about 10 nm, a portion of the material for forming the thickness of the adhesion promoting layer 130, which is to be removed from the resulting structure described later, increases. The thickness may be defined in a direction normal to a surface upon which the adhesion promoting layer 130 is coated.

However, the invention is not limited to the above process of increasing an adhesive force within the pattern formation region A of the first substrate 110. In an embodiment, for example, instead of coating a material for forming the adhesion promoting layer 130, an oxygen plasma treatment and/or an UV ozone treatment may be performed on the pattern formation region A of the first substrate 110, which is exposed by the mask 120, to increase the adhesive force of the first substrate 110 with respect to the resin in the pattern formation region A.

To perform the oxygen plasma treatment on the pattern formation region A, the pattern formation region A, the first substrate 110 and layers thereon may be processed in a process chamber for performing the oxygen plasma treatment. A chamber pressure within the process chamber may be maintained at about 0.4 millibar (mbar), while about 100 watts (W) of power is used, and oxygen gas is supplied at about 5 standard cubic centimeters per minute (sccm) into the chamber. The oxygen plasma treatment is performed for about 60 seconds.

To perform the UV ozone treatment on the pattern formation region A, a UV lamp is used to irradiate a UV light with a wavelength of about 254 nm and an intensity of about 28,000 microwatts per square centimeter ($\mu W/cm^2$) for about 90 seconds, such as to the pattern formation region A, the first substrate 110 and layers thereon. Within a process chamber for performing the UV ozone treatment, the UV light reacts with oxygen in the process chamber, and thus, ozone and oxygen atoms providing relatively strong oxidation are generated. The oxygen atoms essentially clean a surface of the transfer substrate exposed at the pattern formation region A to increase the adhesive force thereof relative to other material layers.

Hereinafter, for convenience of explanation, a region modified by the oxygen plasma treatment or the UV ozone treatment may also be referred to as the adhesion promoting layer 130.

Figure 1C:
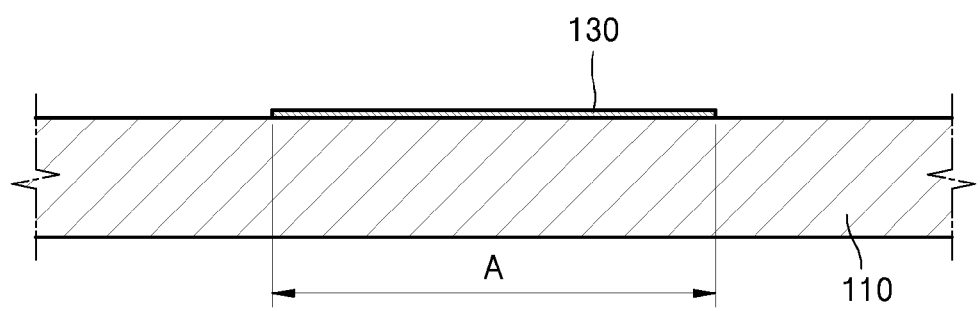

Referring to FIG. 1C, the mask 120 is removed from the first substrate 110. In removing the mask 120 from the first substrate 110, the adhesion promoting layer 130 disposed on the mask is detached from the first substrate 110 together with the mask 120. A portion of the adhesion promoting layer 130 may remain on the pattern formation region A due to the adhesive force with the first substrate 110.

When a film having an electrostatic force is used as the mask 120, the mask 120 may be relatively easily detached from the first substrate 110.

When a release film is used as the mask 120, the mask 120 may be relatively easily separated from the first substrate 110 by applying heat thereto.

When a tape is used as the mask 120, the adhesion promoting layer 130 on the tape may be removed by removing the tape.

Figure 1D:
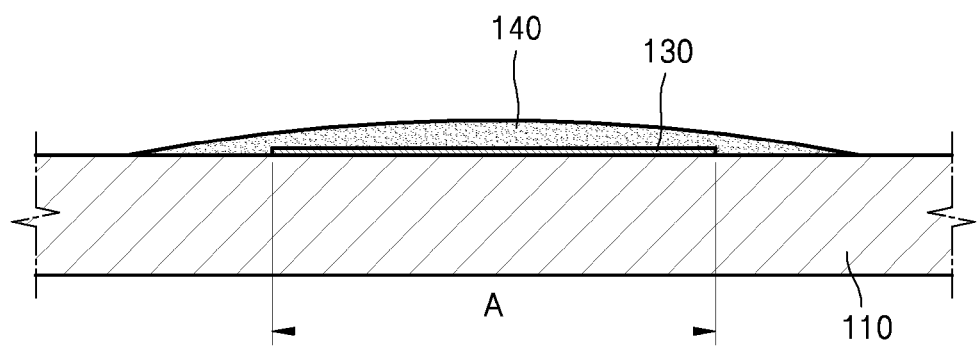

Referring to FIG. 1D, a UV-curable resin 140 is coated on the first substrate 110 to cover the adhesion promoting layer 130. The UV-curable resin 140 may be, for example, an acryl-based resin, a polyimide-based resin, a polyamide-based resin, a novolac-based resin, a poly methyl methacrylate ("PMMA") resin, a buthyl methacrylate ("BMA") resin, an urethane acrylate resin, a poly vinyl alcohol resin, or the like. The adhesion promoting layer 130 covers the pattern formation region A. The adhesion promoting layer 130 may extend further than the pattern formation region A to overlap a portion of the first substrate 110 adjacent to the pattern formation region A.

Figure 1E:
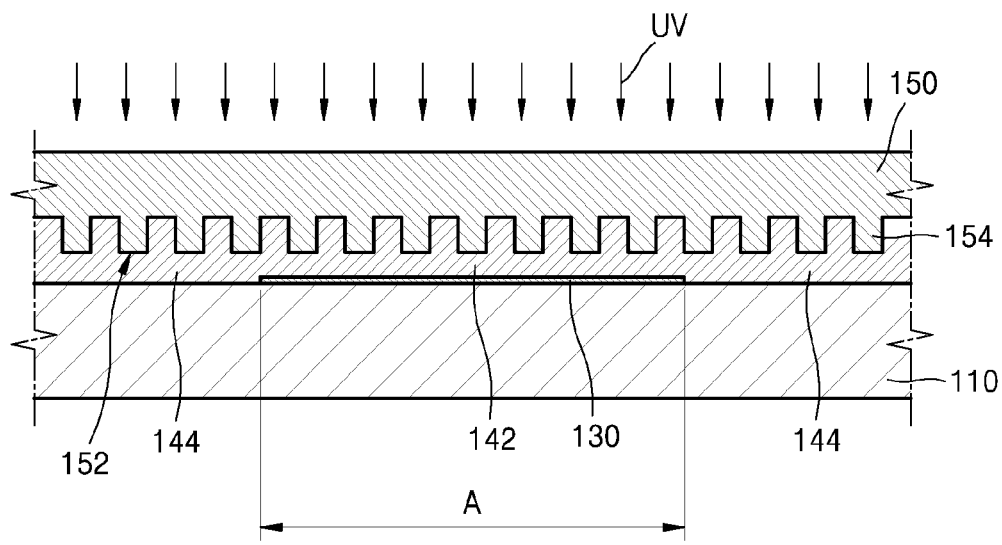

Referring to FIG. 1E, a stamp mold 150 is pressed onto the first substrate 110 with the UV-curable resin 140 thereon. The stamp mold 150 includes a first pattern 152 formed therein, and the first pattern 152 contacts the resin 140 on the first substrate 110 by the pressing of the stamp mold 150 onto the first substrate 110. Thereafter, UV light is irradiated onto the UV-curable resin 140. In this process, the UV-curable resin 140 may be chemically bonded to be relatively strongly bonded to the adhesion promoting layer 130 on the pattern formation region A of the first substrate 110. That is, the coupling agent included in the adhesion promoting layer 130 may be chemically bonded to the UV-curable resin 140. Thus, the adhesive force between the UV-curable resin 140 and the adhesion promoting layer 130 may be increased.

The stamp mold 150 may include quartz or UV-curable polymer, for example, polyurethane acrylate.

The UV-curable resin 140 may also be coated in a region outside the pattern formation region A on the first substrate 110. Although not illustrated, a burr may be formed from the UV-curable resin 140 disposed outside the pattern formation region A.

The first pattern 152 is transferred to the UV-curable resin 140 to form a second pattern portion 142 and a third pattern portion 144 of the UV-curable resin 140. The second pattern portion 142 and the third pattern portion 144 of the UV-curable resin 140 may have the same shape as each other and may be formed at different positions along the first substrate 110. That is, the second pattern portion 142 is a patterned portion of the UV-curable resin 140 corresponding to the pattern formation region A, and the third pattern portion 144 is a patterned portion of the UV-curable resin 140 disposed corresponding to an area other than the second pattern portion 142.

Figure 1F:
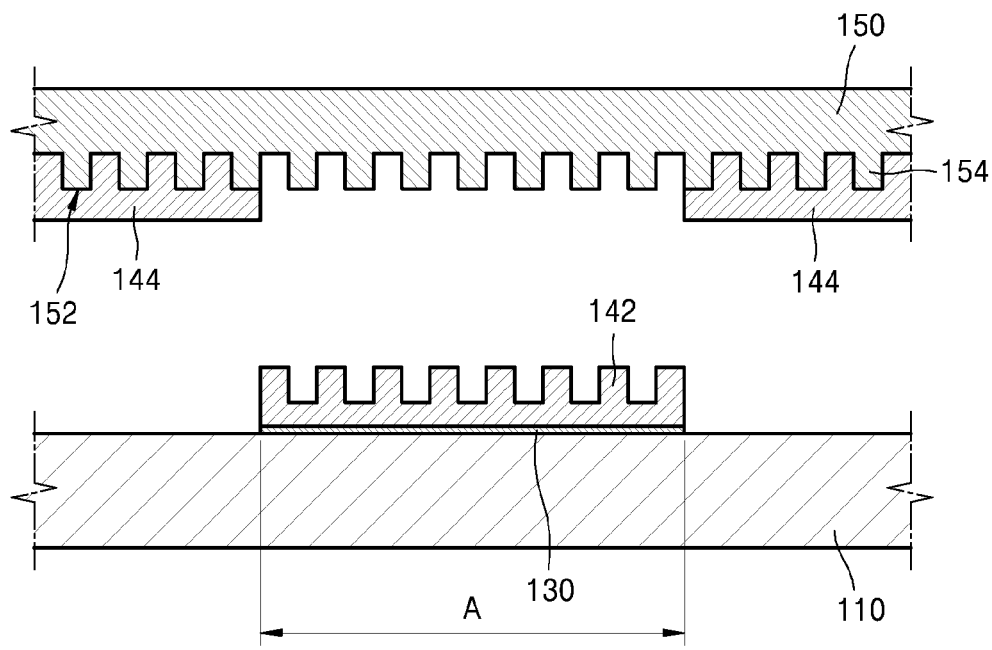

Referring to FIG. 1F, the stamp mold 150 is separated from the first substrate 110. In this process, the second pattern portion 142 on the adhesion promoting layer 130 remains on the first substrate 110 due to the adhesive force with the adhesion promoting layer 130, and the third pattern portion 144 in a remaining region of the of the UV-curable resin 140 disposed on the first substrate 110 is separated from the first substrate 110. Since the distance between convex portions 154 of the first pattern 152 is in range of nanometers or micrometers, the resin (e.g., the third pattern portion 144) filling a space defined between the convex portions 154 has a relatively large surface contact area with surfaces of the first pattern 152. Thus, the bonding force of the third pattern portion 144 with the first pattern 152 is stronger than the bonding force of the third pattern portion 144 with the first substrate 110. In contrast, since the second pattern portion 142 between the adhesion promoting layer 130 and the stamp mold 150 has a relatively strong bonding force with the adhesion promoting layer 130, the second pattern portion 142 remains on the adhesion promoting layer 130.

According to one or more embodiment, even when a burr is formed due to deposition of an excessive amount of UV-curable resin 140 in a region outside the pattern formation region A and between the first substrate 110 and the stamp mold 150, since the burr is formed in the region outside the pattern formation region A, the burr is removed from the first substrate 110 together with the stamp mold 150. Also, even when the stamp mold 150 is not accurately aligned with the first substrate 110, the second pattern portion 142 is formed only in the desired pattern formation region A owing to the UV-curable resin 140 disposed on the adhesion promoting layer 130.

Figure 2A:
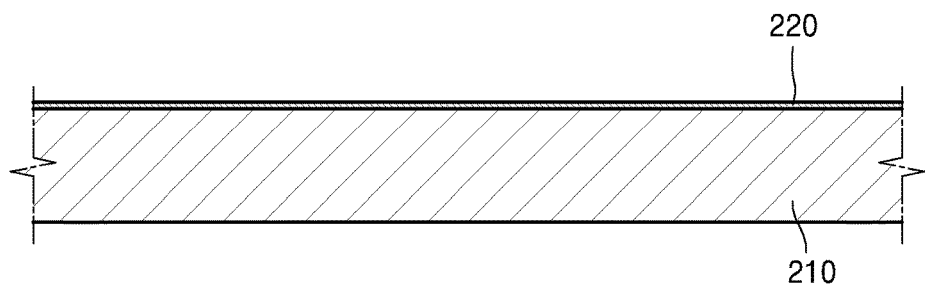
FIGS. 2A to 2C are cross-sectional views schematically illustrating a method of removing a resin formed on a stamp mold according to an embodiment.
Figure 2B:
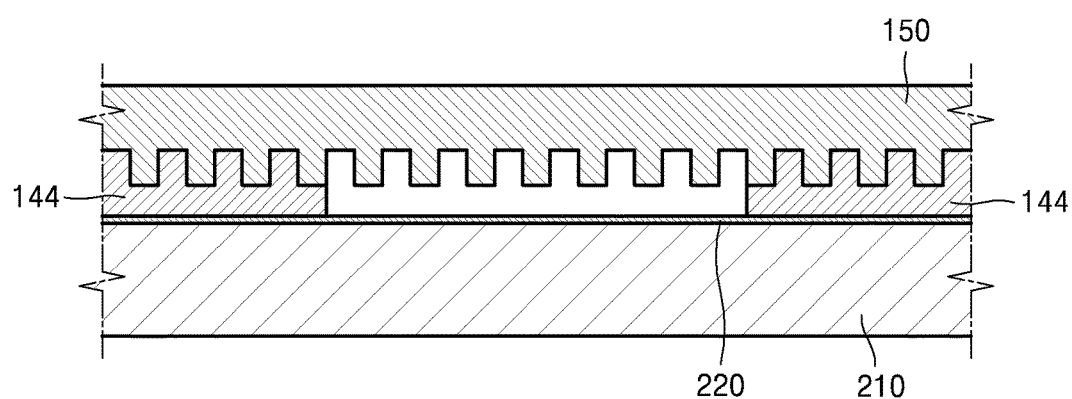
Figure 2C:
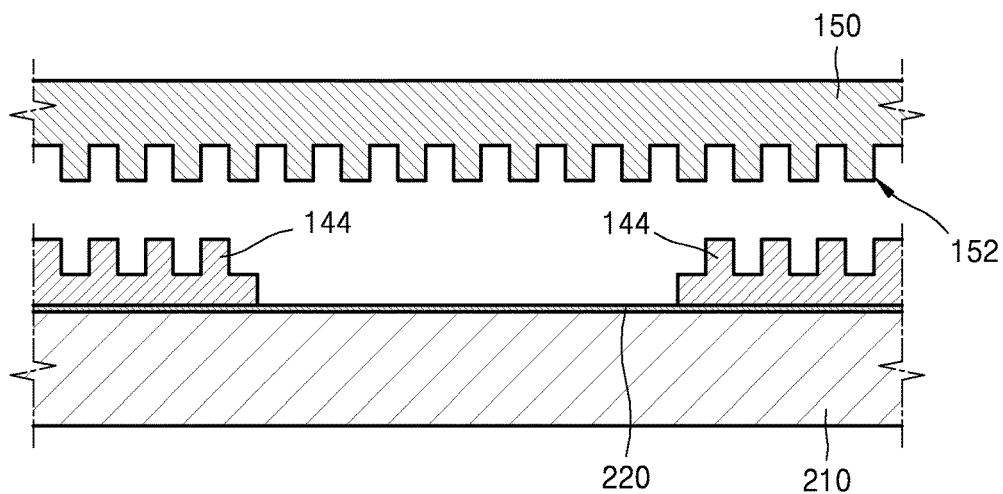

FIGS. 2A to 2C are cross-sectional views schematically illustrating a method of removing the resin coated on the stamp mold 150 according to an embodiment. The same reference numerals in FIGS. 2A to 2C as in FIGS. 1A to 1F denote the same elements, and redundant descriptions thereof will be omitted.

Referring back to FIG. 1F, after the second pattern portion 142 is formed in the desired pattern formation region A on the first substrate 110, the third pattern portion 144, which is a residual resin, is removed from the stamp mold 150 in order to reuse the stamp mold 150.

Referring to FIG. 2A, an adhesive layer 220 is formed on a second substrate 210. The adhesive layer 220 may be coated on an entire top surface of the second substrate 210. The second substrate 210 may include any of a number of materials that has a relatively strong adhesive force with the adhesive layer 220. In an embodiment, for example, the second substrate 210 may include glass, silicon, or plastic.

The adhesive layer 220 may include the same material as the adhesion promoting layer 130 described above, and redundant descriptions thereof will be omitted. The adhesive layer 220 may be formed by spin coating, drop dispensing or deposition.

However, the invention is not limited to the above process of increasing an adhesive force of the second substrate 210. In an embodiment, for example, instead of coating the adhesive layer 220, an oxygen plasma treatment or a UV ozone treatment may be performed on the top surface of the second substrate 210 to increase the adhesive force of the second substrate 210. Hereinafter, for convenience sake, a region modified by the oxygen plasma treatment or the UV ozone treatment may also be referred to as the adhesive layer 220.

Referring to FIG. 2B, the stamp mold 150 having the third pattern portion 144 thereon, is pressed onto the second substrate 210 having the adhesive layer 220 thereon, so that the third pattern portion 144 on the stamp mold 150 is attached onto the adhesive layer 220 on the second substrate 210. UV light may be irradiated onto the stamp mold 150 in order to increase the bonding force between the adhesive layer 220 and the third pattern portion 144, but the invention is not limited thereto.

In an embodiment, a double-side tape may be used as the adhesive layer 220. When the double-sided tape is used as the adhesive layer 220, the irradiation of UV light onto the adhesive layer 220 may be omitted.

Referring to FIG. 2C, when the stamp mold 150 is detached from the second substrate 210, the third pattern portion 144 formed within the first pattern 152 of the stamp mold 150 is separated from the stamp mold 150 by being attached to the adhesive layer 220. Thus, the stamp mold 150 without the third pattern portion 144 thereon may be reused in the method of forming an aligned pattern in a pattern formation region by using an imprint process.

As described above, according to the one or more embodiment, even when a burr is formed due to deposition of an excessive amount of resin outside a pattern formation region and between the transfer substrate and the stamp mold, the burr is removed from the transfer substrate together with the stamp mold. Also, even when the stamp mold is not accurately aligned with the transfer substrate, the transfer pattern may be formed only in the desired pattern formation region owing to the adhesion of the resin disposed with the adhesion promoting layer on which it is disposed.

It should be understood that the embodiments described herein should be considered in a descriptive sense only and not for purposes of limitation. Descriptions of features within each embodiment should typically be considered as available for other similar features in other embodiments.

What is claimed is:

1. An imprint process method of forming an aligned pattern, the method comprising:
    forming an adhesion promoting layer only in a pattern formation region on a first substrate;
    coating a resin on the first substrate to cover the adhesion promoting layer;
    transferring a first pattern of a stamp mold to the resin coated on the first substrate and covering the adhesion promoting layer, by pressing the stamp mold onto the resin coated on the first substrate and covering the adhesion promoting layer;
    irradiating ultraviolet light onto the resin coated on the first substrate and covering the adhesion promoting layer, to cure the resin and form a second pattern of the cured resin to correspond to the first pattern of the stamp mold, on the first substrate; and
    detaching the stamp mold from the substrate, to leave a portion of the cured resin second pattern only on the adhesion promoting layer on the first substrate and to remove a remaining portion of the cured resin second pattern from the first substrate.

2. The method of claim 1, wherein the forming the adhesion promoting layer comprises:
    forming a mask on the first substrate to expose the pattern formation region;
    forming an adhesion promoting material layer on the first substrate to cover the mask and to cover the pattern formation region; and
    removing the mask from the first substrate to remove a portion of the adhesion promoting material layer formed in a region outside the pattern formation region.

3. The method of claim 2, wherein the adhesion promoting material layer comprises an ultraviolet-curable material.

4. The method of claim 2, wherein the adhesion promoting material layer comprises a solution of a silane coupling agent.

5. The method of claim 2, wherein the adhesion promoting material layer is formed on the first substrate in a dry state to have a thickness of about 10 nanometers or less.

6. The method of claim 2, wherein the adhesion promoting layer is formed on the first substrate by spin coating or vapor deposition.

7. The method of claim 2, wherein the forming the mask on the first substrate comprises attaching a mask material layer onto the first substrate by an electrostatic force or a reversible bonding.

8. The method of claim 7, wherein the mask material layer comprises a polymer film or a release film.

9. The method of claim 1, wherein the forming the adhesion promoting layer comprises:
   forming a mask on the first substrate to expose a surface of the substrate in the pattern formation region; and
   performing an oxygen plasma treatment or an ultraviolet ozone treatment on the surface of the first substrate exposed in the pattern formation region.

10. The method of claim 1, wherein the curing the resin comprises chemically bonding the adhesion promoting layer and the resin to each other.

11. The method of claim 1, further comprising:
   forming an adhesive layer on a second substrate separate from the first substrate;
   pressing the stamp mold with the remaining portion of the cured resin second pattern thereon, onto the second substrate with the adhesive layer thereon, such that the remaining portion of the cured resin second pattern on the stamp mold contacts the adhesive layer on the second substrate; and
   detaching the stamp mold from the second substrate to leave the remaining portion of the cured resin second pattern in contact with the adhesive layer on the second substrate and to remove the remaining portion of the cured resin second pattern from the stamp mold.

12. The method of claim 11, wherein the adhesive layer comprises a double-sided tape.

* * * * *